United States Patent
Okudaira

(10) Patent No.: US 6,764,896 B2
(45) Date of Patent: Jul. 20, 2004

(54) SEMICONDUCTOR MANUFACTURING METHOD INCLUDING PATTERNING A CAPACITOR LOWER ELECTRODE BY CHEMICAL ETCHING

(75) Inventor: Tomonori Okudaira, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/246,521

(22) Filed: Sep. 19, 2002

(65) Prior Publication Data

US 2003/0143805 A1 Jul. 31, 2003

(30) Foreign Application Priority Data

Jan. 30, 2002 (JP) ........................................ 2002-021171

(51) Int. Cl.[7] .......................................... H01L 21/8242
(52) U.S. Cl. ...................... 438/238; 438/253; 438/254; 438/396; 438/397
(58) Field of Search ...................... 438/238, 253–256, 438/396–399

(56) References Cited

U.S. PATENT DOCUMENTS 6,432,835 B1 * 8/2002 Yunogami et al. .......... 438/720

FOREIGN PATENT DOCUMENTS

| JP | 9-134908 | 5/1997 |
| JP | 9-266200 | 10/1997 |
| JP | 1064843 | 3/1998 |
| JP | 2000-183303 | 6/2000 |

* cited by examiner

Primary Examiner—Thanh Nguyen
(74) Attorney, Agent, or Firm—Oblon, Spivak, McClelland, Maier & Neustadt, P.C.

(57) ABSTRACT

Sputter etching of silicon oxide films is performed with an etching gas such as $C_4F_8$. Since a silicon nitride film is little etched at this time, when the etching is performed under a condition of sufficient overetching for the silicon oxide films, the silicon nitride film serves as an etching stopper, and the silicon oxide film on a platinum film and the silicon oxide film other than a portion below the platinum film are completely removed and the silicon oxide film remains only below the platinum film, to form a protrusion of a layer consisting of the silicon oxide film and the platinum film from a surface of the silicon nitride film. Thus, in patterning, a capacitor lower electrode by chemical etching, a nonuniform etching caused by temperature distribution on a substrate or among a plurality of substrates can be solved.

10 Claims, 13 Drawing Sheets

F / G. 1
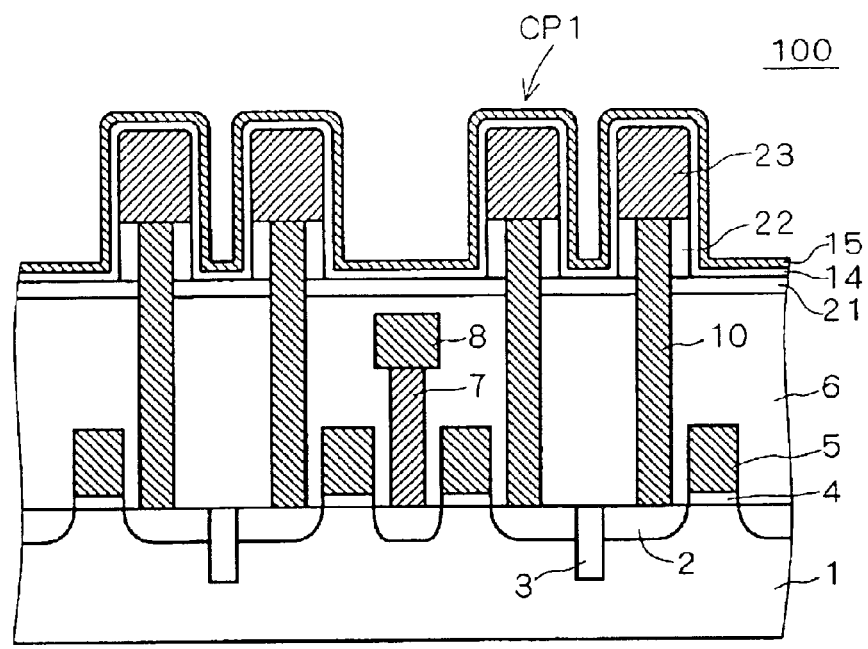
F / G. 2
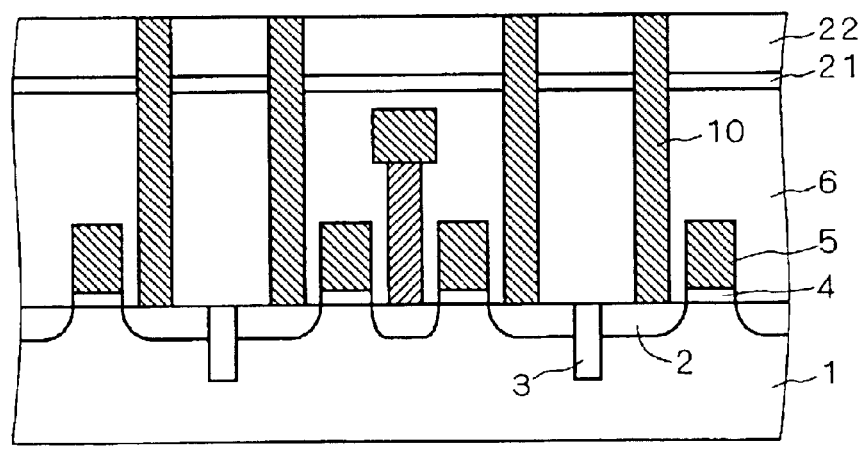

F I G. 10
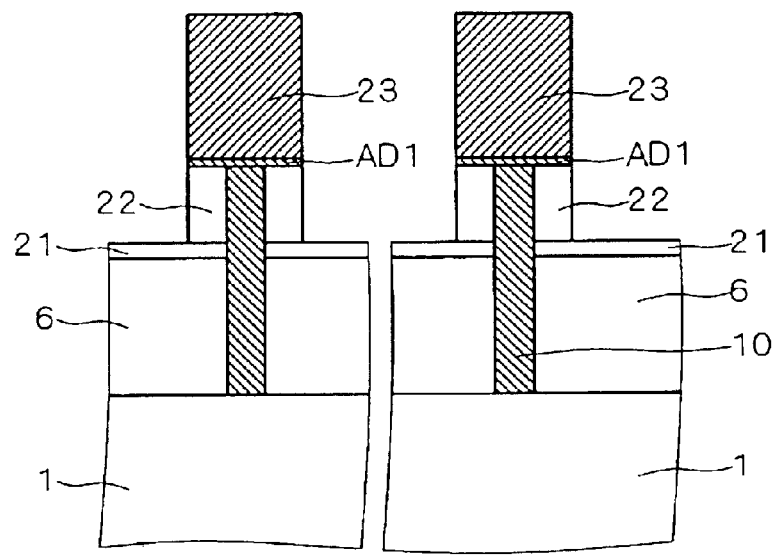
F I G. 11
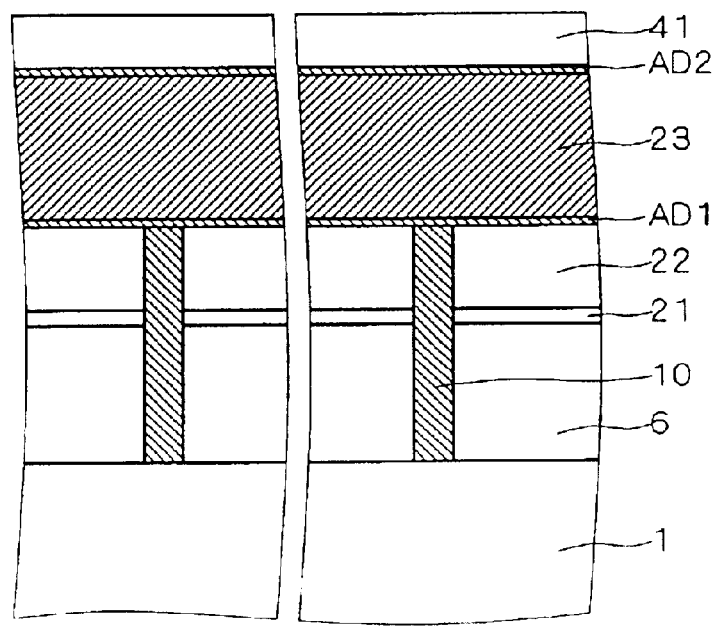

SEMICONDUCTOR MANUFACTURING METHOD INCLUDING PATTERNING A CAPACITOR LOWER ELECTRODE BY CHEMICAL ETCHING

BACKGROUND OF THE INVENTION

1. Field of the Invention

The present invention relates to a semiconductor device, and more particularly to a semiconductor device having a capacitor.

2. Description of the Background Art

In a semiconductor device having a capacitor, such as DRAM (dynamic random access memory), since the capacitor capacitance does not response to the scaling law of high integration only by improving the capacitor structure, it is now considered to use materials of high dielectric constant, such as $Ta_2O_5$, $(Ba, Sr)TiO_3$, $Pb(Zr, Ti)O_3$, $Pb(La, Ti) O_3$ and SBT $(SrBi_2Ta_2O_9)$ as a dielectric to form a capacitor insulating film.

Further, as to a nonvolatile memory, ferroelectric memory utilizing polarization reversal of ferroelectrics is being developed.

In a case where a capacitor insulating film is formed of a material of high dielectric constant such as above, a capacitor electrode is generally formed mainly of a platinum-group element or an oxide of a platinum-group element.

Since the platinum-group element generally has a characteristic of low vapor pressure in a compound, an etching with ions of high energy, i.e., sputter etching is used in electrode formation. This method is a physical etching, and has problems that the selection ratio of mask material and workpiece is small, that the etching section has a tapered shape and microfabrication is difficult.

Then, a technique such as reactive ion etching using chemical etching method as well as physical etching with the wafer temperature kept high and the vapor pressure of reactive compound raised higher has been considered. This method uses a heat-resistant material such as a silicon oxide film, a silicon nitride film and a titanium nitride film, i.e., a hardmask as a mask material for electrode formation.

Hereafter, a background-art manufacturing method using reactive ion etching will be discussed, referring to cross sections of FIGS. 15 to 21 showing the manufacturing process step by step.

First, in the step of FIG. 15, a silicon substrate 1 is prepared and an isolation insulating film 3 which electrically isolates elements and defines an active region which is to become an element formation region is formed. On the active region defined by the isolation insulating film 3, a gate insulating film 4 and a gate electrode 5 of a MOS transistor are selectively formed. Then, an impurity diffusion layer 2 which is to become a source/drain layer is selectively formed in a main surface of the silicon substrate 1 with the gate electrode 5 used as a mask.

After that, an interlayer insulating film 6 is so formed on the silicon substrate 1 as to completely cover the MOS transistor. At this time, a contact plug 7 (bit line contact) connected to a predetermined impurity diffusion layer 2 and a bit line 8 electrically connected to the predetermined impurity diffusion layer 2 through the contact plug 7 are formed in the interlayer insulating film 6.

After forming a silicon nitride film 11 on the interlayer insulating film 6 as an etching stopper, a plurality of contact plugs 10 (storage node contacts) penetrating the interlayer insulating film 6 and the silicon nitride film 11 to be connected to the predetermined impurity diffusion layer 2 are formed. Further, the contact plugs 7 and 10 are each formed of a conductor such as polysilicon.

Next, in the step of FIG. 16, a platinum film 12 and a silicon oxide film 13 are formed in this order on the silicon nitride film 11. After that, a resist mask RM1 which is so patterned as to correspond to a pattern of a capacitor lower electrode (storage node) is formed on the silicon oxide film 13.

Next, in the step of FIG. 17, the silicon oxide film 13 is patterned with the resist mask RM1 used as an etching mask. This serves as a hardmask.

Next, in the step of FIG. 18, the platinum film 12 is patterned with this hardmask used as an etching mask, to form the capacitor lower electrode. After that, the silicon oxide film 13 serving as the hardmask is removed with the silicon nitride film 11 in an underlying layer located below the capacitor used as an etching stopper.

Next, in the step of FIG. 19, a capacitor dielectric film 14 is so formed as to cover the platinum film 12 serving as the capacitor lower electrode and on the capacitor dielectric film 14, a conductive film is formed as a capacitor upper electrode 15. The capacitor lower electrode 12, the capacitor dielectric film 14 and the capacitor upper electrode 15 constitute a capacitor CP.

Further, besides the above-discussed background-art method, Japanese Patent Application Laid Open Gazette No. 9-266200 discloses a manufacturing technique as below, which is intended to achieve an easy microfabrication of ferroelectrics or platinum electrode.

Specifically, on a device insulating film formed on a semiconductor substrate, a multilayer film consisting of a lower platinum film, a ferroelectric film and an upper platinum film is formed and on the multilayer film, a titanium film whose thickness is a tenth or less of that of the multilayer film is formed. After patterning the titanium film with a photoresist film, the multilayer film is etched with a mixed gas of oxygen and chlorine, whose oxygen concentration is 40%, with the patterned titanium film used as an etching mask. After that, the titanium film is removed by etching with a chlorine gas.

Furthermore, Japanese Patent Application Laid Open Gazette No. 2000-183303 discloses a manufacturing technique as below, which is intended to achieve a microfabrication of ruthenium electrode with excellent anisotropy.

Specifically, on a silicon oxide film, a multilayer film consisting of a silicon nitride film, a ruthenium film and a platinum film is formed and on the multilayer film, another silicon oxide film is formed. After patterning the higher silicon oxide film with a photoresist film, the platinum film and the ruthenium film are etched with the patterned silicon oxide film used as an etching mask. Finally, the silicon oxide film used as the etching mask is removed with the silicon nitride film formed below the ruthenium film as an etching stopper.

In these cases, there is a problem in the step of patterning the capacitor lower electrode formed of a platinum-group element. Though the chemical etching contributes to the etching of the platinum-group element as discussed earlier, the platinum-group element has an etching characteristic of large temperature dependency and due to the temperature distribution on a wafer or among a plurality of wafers processed simultaneously, an etching speed (etching rate) disadvantageously becomes nonuniform on the wafer surface or among the simultaneously-processed wafers.

FIG. 20 shows the temperature dependencies in etching rates of platinum (Pt), silicon nitride film (SiN) and silicon oxide film ($SiO_2$) in patterning the capacitor lower electrode, for example, under the etching condition that a chlorine gas and an argon gas are used as etching gas with respective flows of 120 sccm and 30 sccm and the pressure in a reaction chamber is 20×0.1333 Pa (20 mTorr).

In FIG. 20, the horizontal axis indicates wafer temperature (°C) and the vertical axis indicates etching rate (nm/min). As is clear from this graph, the temperature dependency of platinum (Pt) is considerably large.

This means that the etching rate of a platinum film is greatly affected by the temperature distribution on a wafer or among a plurality of wafers.

It is assumed now that the preset temperature of the wafer is 370° C. and the platinum film 12 having a thickness of 20 nm formed on the silicon nitride film 11 is patterned in the above-discussed manufacturing process. There arises a temperature distribution where the lowest temperature region has a temperature of 360° C. and the highest temperature region has a temperature of 380° C. on the main surface of the silicon substrate 1, and there is a temperature difference of 20° C. on the main surface of the silicon substrate 1.

If the amount of overetching in the lowest temperature region (360° C.) is 10%, the etching time for the platinum film 12 is three minutes and forty seconds which is obtained from the characteristics shown in FIG. 20. In this case, the amount of etching of the silicon nitride film 11 in the underlying layer is 37 nm.

On the other hand, the etching time for the platinum film 12 in the highest temperature region (380° C.) is about two minutes and twenty seconds which is obtained from the characteristics shown in FIG. 20, and therefore the silicon nitride film 11 in the underlying layer is etched for remaining one minute and twenty seconds and the amount of etching thereof is as much as 142 nm.

Herein, the etching state of the platinum film 12 in the case where the above temperature distribution is present is schematically shown in FIG. 21. Further, FIG. 21 shows a process step of FIG. 18 but the structure of the MOS transistor and the like are omitted for simplification.

As shown in FIG. 21, since the height of the platinum film 12 including a protrusion of the silicon nitride film 11 varies from 237 nm to 342 nm on a substrate, the aspect ratio varies depending on portions and it therefore becomes difficult to cover the film with the later-formed capacitor dielectric film at a uniform thickness.

FIG. 22 shows a state where the capacitor dielectric film 14 and the capacitor upper electrode 15 are formed.

As shown in FIG. 22, due to the variation in the amount of etching of the silicon nitride film 11, there arises a distribution of thickness of the silicon nitride film 11 on a substrate. This causes a variation in parasitic capacitance PC between the capacitor upper electrode 15 and an interconnection layer provided in the interlayer insulating film 6, such as the bit line 8, making a capacitance design difficult.

SUMMARY OF THE INVENTION

It is an object of the present invention is to solve the problem of nonuniform etching which is caused by the temperature distribution on a substrate or among a plurality of substrates when a capacitor lower electrode is patterned by chemical etching.

According to a first aspect of the present invention, the method of manufacturing a semiconductor device which includes a capacitor having a lower electrode selectively formed on an underlying layer, a dielectric film covering the lower electrode and an upper electrode opposed to the lower electrode with the dielectric film interposed therebetween includes the following steps (a) to (f).

The step (a) is to form first and second etching stopper films whose materials are different from each other in this order as the underlying layer on an interlayer insulating film. The step (b) is to form a conductive film which is to become the lower electrode on the second etching stopper film. The step (c) is to form a hardmask having a pattern corresponding to a plane pattern of the lower electrode on the conductive film. The step (d) is to from the lower electrode patterning at least the conductive film with the hardmask used as an etching mask and the second etching stopper film as an etching stopper. The step (e) is to completely remove at least the second etching stopper film other than a portion below the lower electrode with the first etching stopper film used as an etching stopper. The step (f) is to form the dielectric film and the upper electrode as to cover the lower electrode and the second etching stopper film remaining below the lower electrode.

Since the lower electrode is formed by patterning at least the conductive film with the second etching stopper film as an etching stopper and at least the second etching stopper film other than a portion below the lower electrode is completely removed with the first etching stopper film used as an etching stopper, when the conductive film is patterned by chemical etching, the etching thickness of the second etching stopper film located below the lower electrode is defined uniformly with the thickness of the second etching stopper film even if there is a temperature distribution on a substrate or among a plurality of substrates. Therefore, it is possible to solve the problem of nonuniform etching of the underlying layer caused by the temperature distribution and provide the dielectric film of uniform thickness which covers the lower electrode. Further, when an interconnection layer is formed in the interlayer insulating film, the parasitic capacitance between the interconnection layer and the upper electrode also becomes uniform and this allows an easy capacitance design.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross section showing a structure of a semiconductor device in accordance with a preferred embodiment of the present invention;

FIGS. 2 to 6 are cross sections showing process steps for manufacturing the semiconductor device in accordance with the preferred embodiment of the present invention;

FIGS. 7 to 14 are cross sections showing process steps for manufacturing the semiconductor device in accordance with a variation of the preferred embodiment of the present invention;

DESCRIPTION OF THE PREFERRED EMBODIMENTS

<A. Device Structure>

Figure 3:
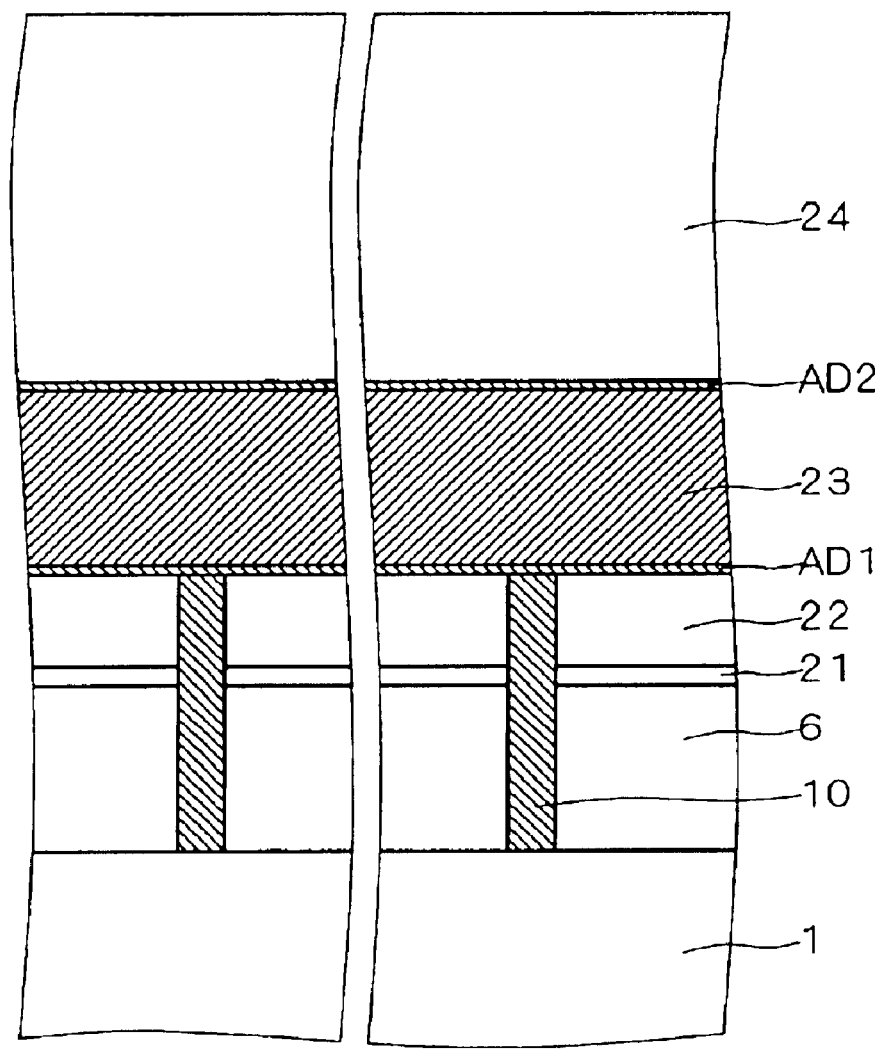

As the preferred embodiment of the present invention, a cross section of a semiconductor device 100 is shown in FIG. 1. As shown in FIG. 1, on the silicon substrate 1, the interlayer insulating film 6 is formed, and in a surface of the silicon substrate 1, a plurality of impurity diffusion layers 2 which are to become source/drain layers of MOS transistors are selectively formed and a plurality of isolation insulating films 3 each of which electrically isolates the MOS transistors and defines an active region including the impurity diffusion layer 2 are selectively formed.

Further, in the interlayer insulating film 6, the gate electrode 5 of a MOS transistor is formed correspondingly to a portion above the silicon substrate 1 between the adjacent impurity diffusion layers 2. Between the gate electrode 5 and the silicon substrate 1, the gate insulating film 4 is formed.

On the interlayer insulating film 6, a silicon nitride film 21 having a thickness of about 20 nm is formed as a first etching stopper and a silicon oxide film 22 having a thickness of about 100 nm is selectively formed on the silicon nitride film 21. This silicon oxide film 22 serves as a second etching stopper in the manufacturing process.

Then, a plurality of contact plugs 10 (storage node contacts) are formed, penetrating the silicon oxide film 22, the silicon nitride film 21 and the interlayer insulating film 6 to be connected to a predetermined impurity diffusion layer 2.

Further, the bit line 8 is selectively formed in the interlayer insulating film 6 and the bit line 8 is connected to the predetermined impurity diffusion layer 2 through the contact plug 7 (bit line contact). The contact plugs 7 and 10 are each formed of a conductor such as titanium nitride and polysilicon.

On the silicon oxide film 22, a platinum film 23 serving as a capacitor lower electrode is formed and a plane pattern of the silicon oxide film 22 coincides with a plane pattern of the platinum film 23.

Then, the capacitor dielectric film 14 is so formed as to cover the silicon oxide film 22 and the platinum film 23, and on the capacitor dielectric film 14, the capacitor upper electrode 15 is formed, to constitute a capacitor CP1.

In the semiconductor device 100 having such a structure, with the presence of the silicon nitride film 21, the etching thickness of the insulating film below the capacitor lower electrode is defined uniformly with the thickness of the silicon oxide film 22, and it is therefore possible to prevent nonuniform etching in patterning of the platinum film 23.

<B. Manufacturing Method>

Hereafter, the above effect will be further discussed, referring to the cross sections of FIGS. 2 to 6 showing the process of manufacturing the semiconductor device 100 step by step.

First, in the step of FIG. 2, the silicon substrate 1 is prepared and the isolation insulating film 3 which electrically isolates elements and defines an active region which is to become an element formation region is formed. On the active region defined by the isolation insulating film 3, the gate insulating film 4 and the gate electrode 5 of a MOS transistor are selectively formed. Then, the impurity diffusion layer 2 which is to become a source/drain layer is selectively formed in the main surface of the silicon substrate 1 with the gate electrode 5 used as a mask.

After that, the interlayer insulating film 6 is so formed on the silicon substrate 1 as to completely cover the MOS transistor. At this time, the contact plug 7 (bit line contact) connected to a predetermined impurity diffusion layer 2 and the bit line 8 electrically connected to the predetermined impurity diffusion layer 2 through the contact plug 7 are formed in the interlayer insulating film 6.

After forming the silicon nitride film 21 having a thickness of about 20 nm by the LPCDV (Low Pressure Chemical Vapor Deposition) method and the like on the interlayer insulating film 6 as a first etching stopper, the silicon oxide film 22 having a thickness of about 100 nm is formed by the LPCVD method and the like on the silicon nitride film 21 as a-second etching stopper.

Further, instead of the silicon nitride film 21, a dielectric film such as BST (barium strontium titanate), ST ($SrTiO_3$), BT ($BaTiO_3$), PZT (lead zirconate titanate), PLZT (addition lanthanum zirconate titanate), PT ($PbTiO_3$) and PZ ($PbZrO_3$) may be formed by the sputtering method.

After forming contact holes which penetrate the silicon oxide film 22, the silicon nitride film 21 and the interlayer insulating film 6 to reach the predetermined impurity diffusion layer 2, conductive layers such as titanium nitride are formed in the silicon oxide film 22 to fill the contact holes. After that, the conductive layers in the silicon oxide film 22 are planarized by the CMP (Chemical Mechanical Polishing) method and the like, to form a plurality of contact plugs 10 electrically connected to the predetermined impurity diffusion layer 2.

Next, in the step of FIG. 3, the platinum film 23 having a thickness of about 200 nm is formed on the silicon oxide film 22 by, e.g., the sputtering method, and on the platinum film 23, a silicon oxide film 24 having a thickness of about 400 nm, serving as a hardmask, is formed by, e.g., the plasma CVD method. In FIGS. 3 to 6, for simplification, the structure of the MOS transistor and the like are omitted.

Further, since the adhesion between the platinum film 23 and the silicon oxide film 22 is weak, thin layers (adhesion layers) AD1 and AD2 such as a titanium film or a titanium nitride (TiN) film may be formed between a lower main surface of the platinum film 23 and the silicon oxide film 22 and between an upper main surface of the platinum film 23 and the silicon oxide film 24 so as to improve the adhesion.

The thickness of the adhesion layers AD1 and AD2 is in a range from 1 to 20 nm (10 to 200 Å), and a metal film such as tantalum (Ta) and cobalt (Co) or a nitride film and a sulfide nitride film of these metals may be formed instead of the titanium film or the titanium nitride film.

Figure 4:
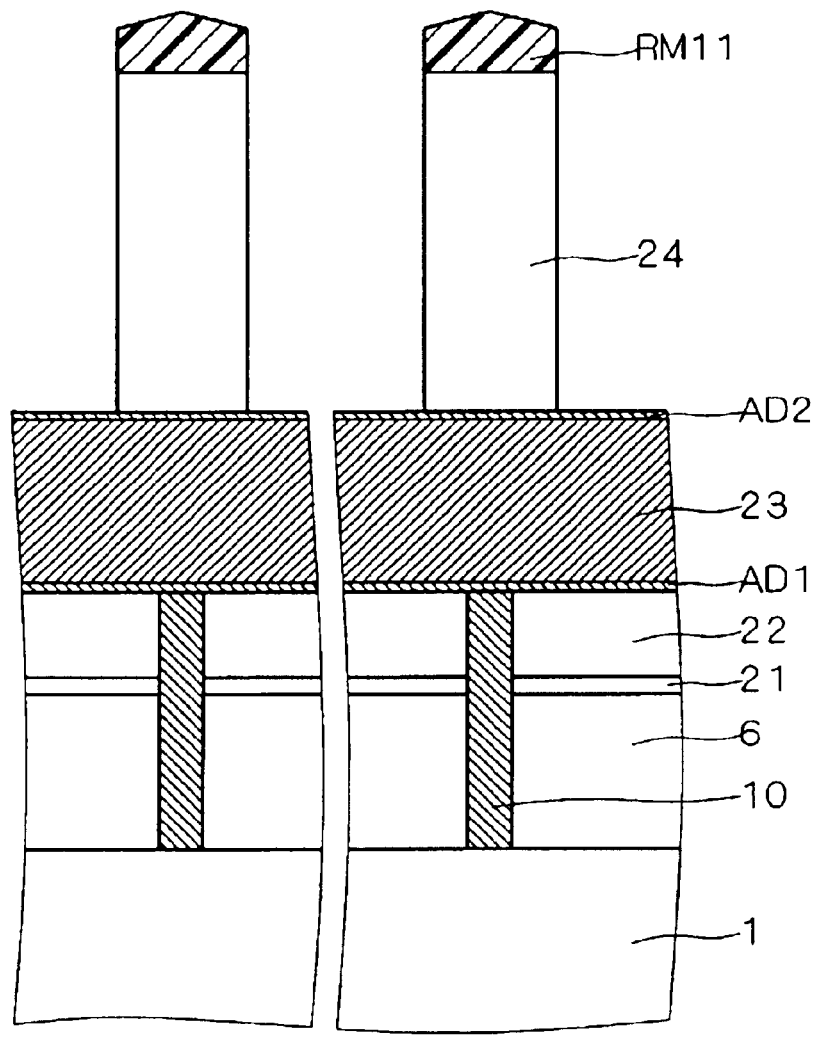

Next, in the step of FIG. 4, a resist mask RM11 which is so patterned as to correspond to the pattern of the capacitor lower electrode is formed on the silicon oxide film 24, and the silicon oxide film 24 is patterned by etching with the resist mask RM11 used as an etching mask. In this etching, the platinum film 23 serves as an etching stopper.

Figure 5:
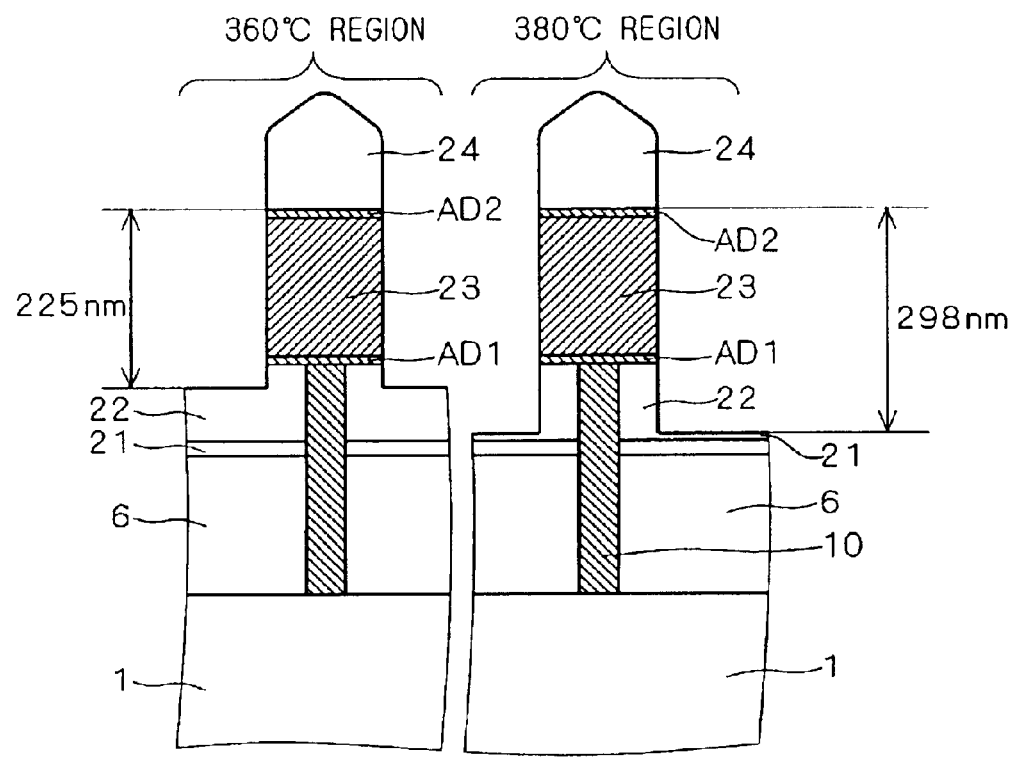

Next, in the step of FIG. 5, after removing the resist mask RM11 remaining on the silicon oxide film 24 by, e.g., oxygen plasma treatment, the platinum film 23 is patterned by dry etching with the silicon oxide film 24 used as a hardmask. The condition for this etching is that a chlorine gas and an argon gas are used in a temperature of, e.g., 370° C. with respective flows of 120 sccm and 30 sccm and the pressure in a reaction chamber is about 20×0.1333 Pa (20 mTorr).

Further, this etching employs a reactive ion etching apparatus using plasma generated by exciting the chlorine gas and the argon gas through high frequency (RF) discharge, where the RF power (source power) used for plasma generation is 1 kW and the bias power applied to the wafer for controlling the energy of ions which enter the wafer from the plasma is 300 W.

In this case, as discussed in the background art, there arises a temperature distribution where the lowest temperature region has a temperature of 360° C. and the highest temperature region has a temperature of 380° C. on the main surface of the silicon substrate 1, and there is a temperature difference of 20° C. on the main surface of the silicon substrate 1.

Figure 20:
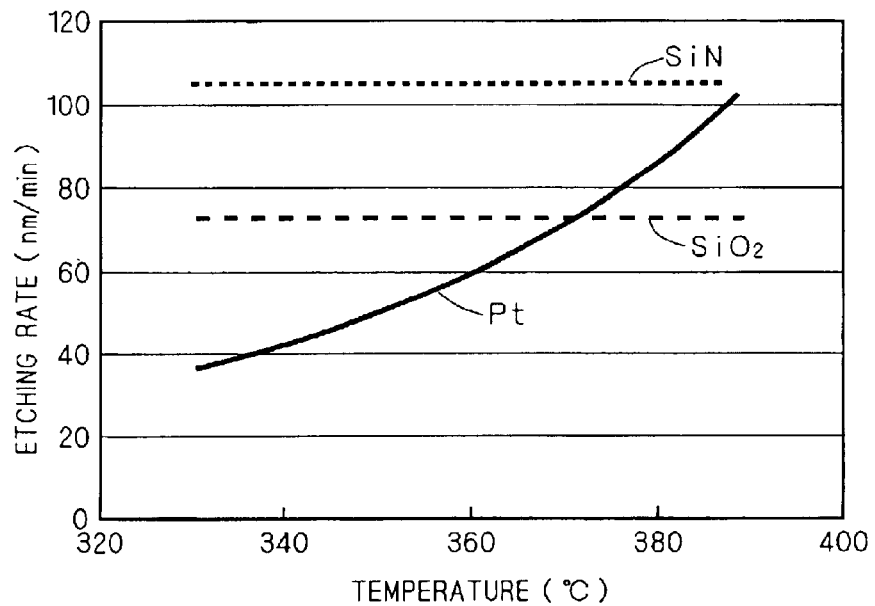
FIG. 20 is a graph indicating the temperature dependencies of etching rates of platinum (PT), a silicon nitride film and a silicon oxide film.
Figure 21:
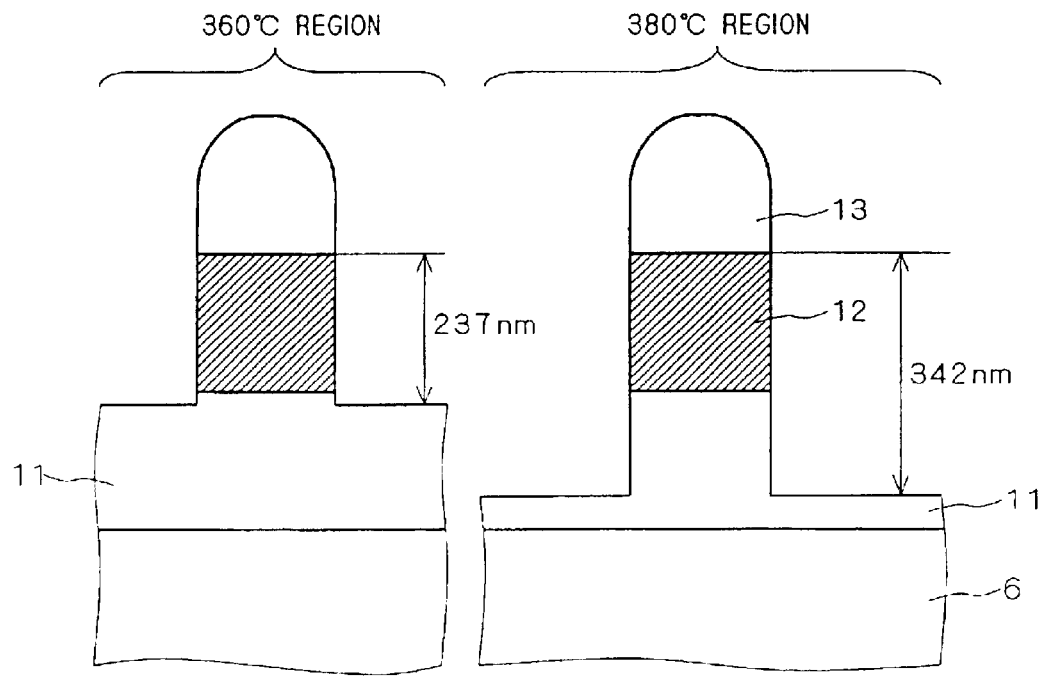
FIGS. 21 and 22 are cross sections showing a problem in the background-art method of manufacturing a semiconductor device.
Figure 22:
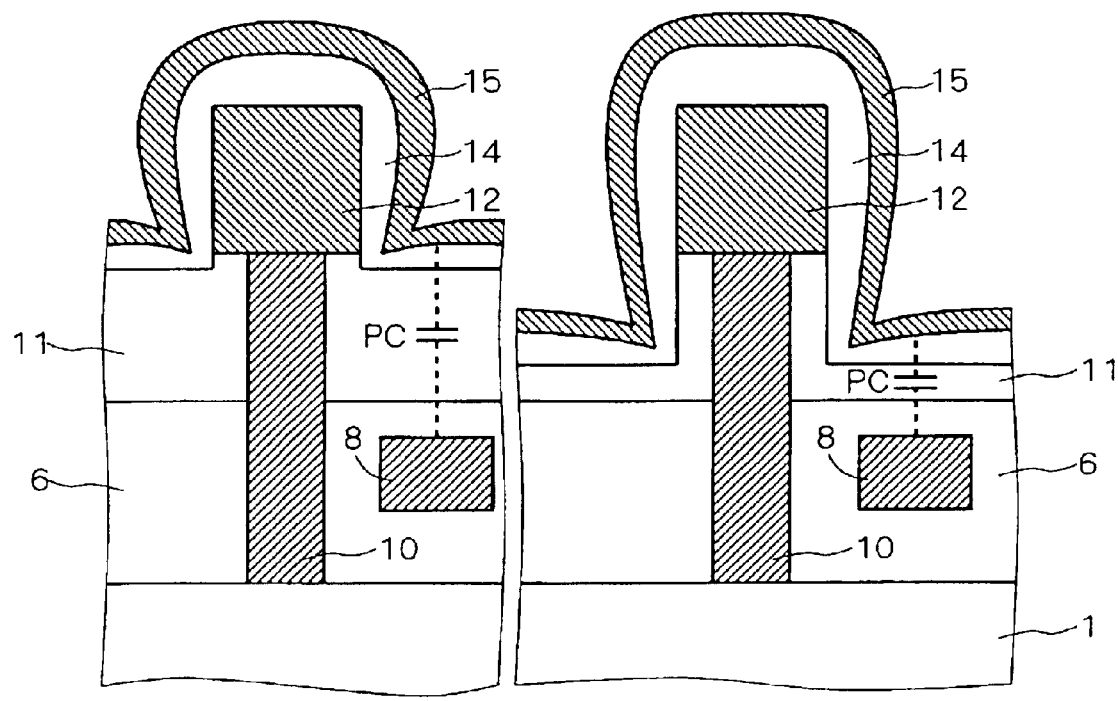

If the amount of overetching in the lowest temperature region (360° C.) is 10%, the etching time for the platinum film 23 is three minutes and forty seconds which is obtained from the characteristics shown in FIG. 20. In this case, the amount of etching of the silicon oxide film 22 is 25 nm.

On the other hand, the etching time for the platinum film 23 in the highest temperature region (380° C.) is about two minutes and twenty seconds which is obtained from the characteristics shown in FIG. 20, and therefore the silicon oxide film 22 is etched for remaining one minute and twenty seconds and the amount of etching is 98 nm. Therefore, in this state, the height of the platinum film 23 including a protrusion of the silicon oxide film 22 varies from 225 nm to 298 nm on a substrate.

Further, since the silicon oxide film 24 serving as the hardmask has an original thickness of about 400 nm, a thickness of about 130 nm at the maximum remains in the etching for three minutes and forty seconds. Furthermore, an upper portion of the silicon oxide film 24 has a section of triangle, being cut by sputter etching.

Figure 6:
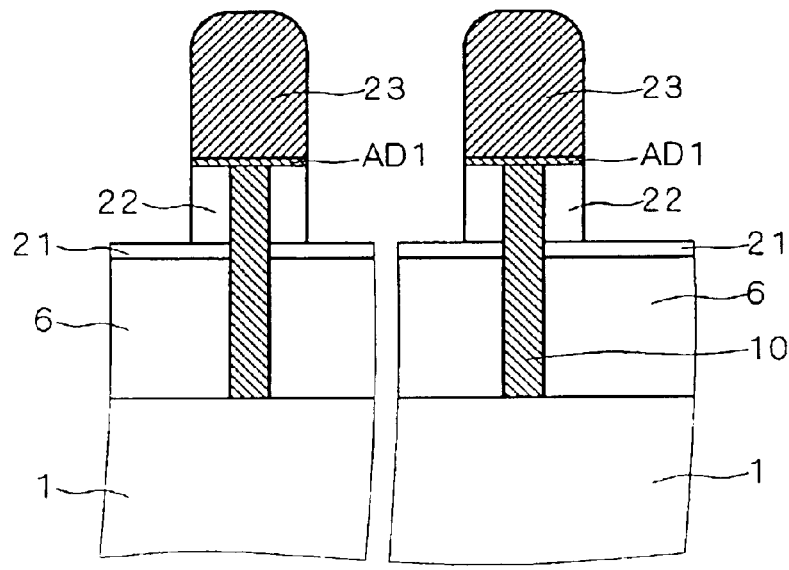

Next, in the step of FIG. 6, sputter etching of the silicon oxide films 24 and 22 is performed with an etching gas such as $C_4F_8$. Since the silicon nitride film 21 is little etched at this time, when the etching is performed under a condition of sufficient overetching for the silicon oxide films 24 and 22, the silicon nitride film 21 serves as an etching stopper, and the silicon oxide film 24 on the platinum film 23 and the silicon oxide film 22 other than a portion below the platinum film 23 are completely removed and the silicon oxide film 22 remains only below the platinum film 23, to form a protrusion of a layer consisting of the silicon oxide film 22 and the platinum film 23 from a surface of the silicon nitride film 21.

As a result, even if there is a temperature distribution on the substrate, the etching thickness of the insulating film below the capacitor lower electrode is defined uniformly with the thickness of the silicon oxide film 22. The same applies to a case where there is a temperature distribution among a plurality of substrates.

Further, though the adhesion layer AD2 between the platinum film 23 and the silicon oxide film 24 is removed by the etching of the silicon oxide film, the adhesion layer AD1 between the platinum film 23 and the silicon oxide film 22 remains.

Furthermore, the above film thickness of the silicon oxide film 22 is an example and the optimum film thickness may be changed depending on the wafer temperature, the temperature distribution and the like. In general, as the wafer temperature becomes higher and the temperature distribution becomes smaller, the film thickness of the silicon oxide film 22 can be made thinner.

<C. Action and Effect>

Thus, in the method of manufacturing a semiconductor device according to the preferred embodiment of the present invention, when the capacitor lower electrode is patterned by chemical etching, it is possible to solve the problem of nonuniform etching caused by the temperature distribution on a substrate or among a plurality of substrates and allow covering with the capacitor dielectric film formed over the capacitor lower electrode at a uniform thickness.

Further, the parasitic capacitance between the interconnection layer formed in the insulating film below the capacitor lower electrode, such as bit line, and the capacitor upper electrode can be made uniform and this allows an easy capacitance design.

<D. The First Variation>

Though the step of removing the silicon oxide film 24 formed on the platinum film 23 and the silicon oxide film 22 other than a portion below the platinum film 23 by etching is shown referring to FIG. 6 in the preferred embodiment of the present invention, there is a possibility that an upper edge of the platinum film 23 is slightly removed by this sputter etching, to have a round shape with curvature. In this case, rounding of the upper edge causes variation in surface area of the capacitor lower electrode. Further, since it is difficult to control the curvature of the upper edge, in order to make the surface areas uniform among a plurality of capacitor lower electrodes, it is desirable to prevent etching of the upper edge of the platinum film 23.

Hereafter, a manufacturing method intended to prevent etching of the upper edge of the platinum film 23 will be discussed, referring to FIGS. 7 to 10. Further, in FIGS. 7 to 10, for simplification, the structure of the MOS transistor and the like will be omitted.

First, through the step discussed referring to FIG. 2, the platinum film 23 having a thickness of about 200 nm is formed on the silicon oxide film 22 by, e.g., the sputtering method. Further, needless to say, the thin adhesion layer AD1 may be formed between th lower main surface of the platinum film 23 and the silicon oxide film 22.

Figure 7:
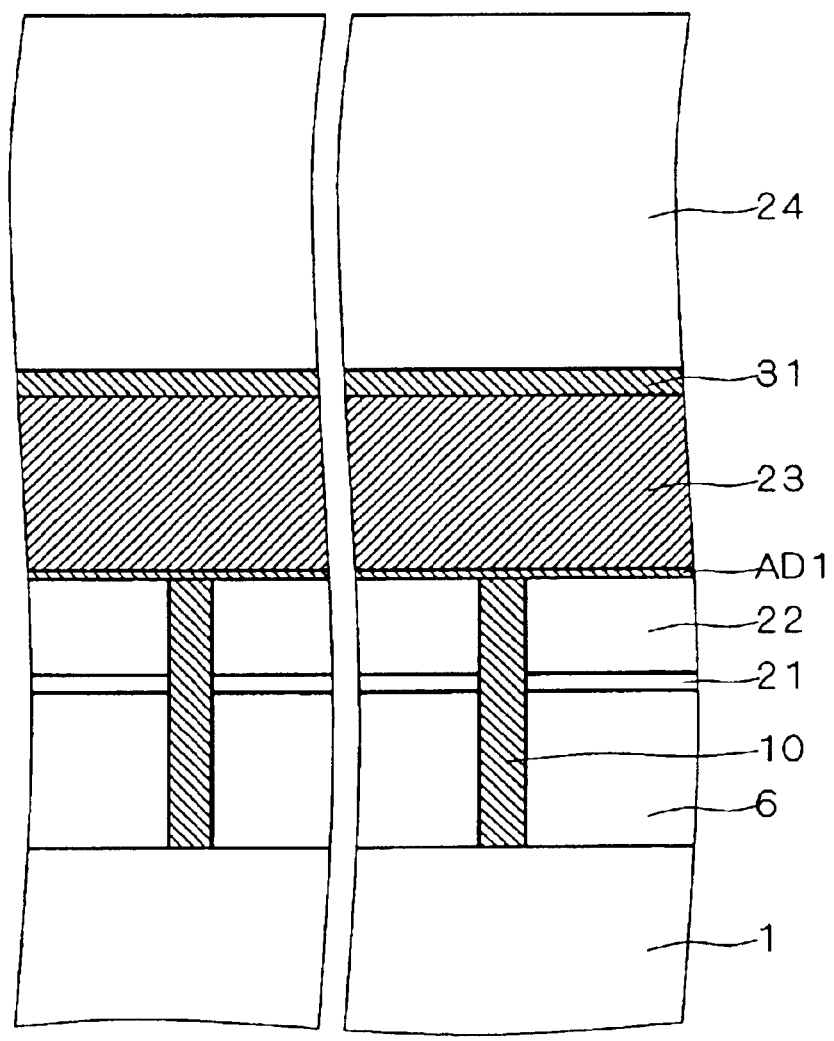

After that, in the step of FIG. 7, a titanium nitride (TiN) film 31 having a thickness of about 20 nm is formed as a sacrifice film on the platinum film 23 by, e.g., the sputtering method. The material for the sacrifice film is not limited to TiN, a material such as TiSiN, AlN and TiAlN, other film formed mainly of Ti or Al and a dielectric film such as BST may be used, only if the etching selectivity thereof to the silicon oxide film is small. Further, the thickness is not limited to 20 nm either, and may be determined in consideration of the etching selection ratio to the silicon oxide film and the like.

After that, the silicon oxide film 24 having a thickness of about 400 nm, serving as a hardmask, is formed on the platinum film 23 by, e.g., the plasma CVD method.

Then, a resist mask (not shown) which is so patterned as to correspond to the pattern of the capacitor lower electrode is formed on the silicon oxide film 24, and the silicon oxide film 24 is patterned by etching with the resist mask used as an etching mask. In this etching, the platinum film 23 serves as an etching stopper.

Figure 8:
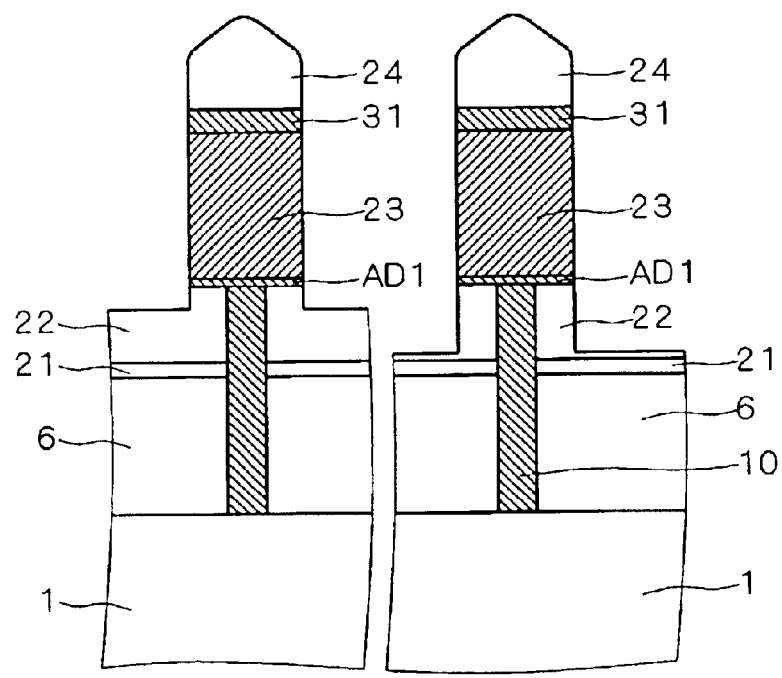

Next, in the step of FIG. 8, after removing the resist mask remaining on the silicon oxide film 24 by, e.g., oxygen plasma treatment, the titanium nitride film 31 and the platinum film 23 are patterned by dry etching with the silicon oxide film 24 used as a hardmask. The condition for this etching is the same as that in the step discussed in the preferred embodiment referring to FIG. 5.

Through this etching, the upper portion of the silicon oxide film 24 has a section of triangle, being cut by sputter etching.

Figure 9:
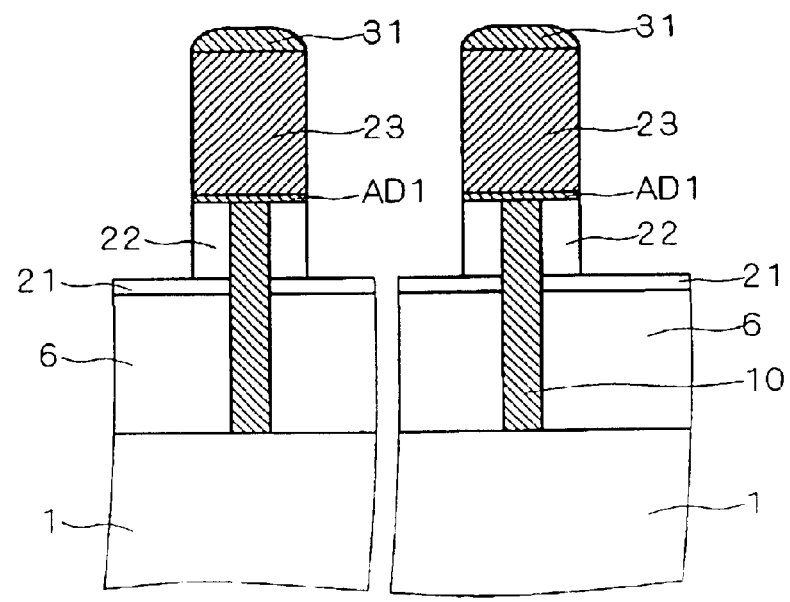

Next, in the step of FIG. 9, sputter etching of the silicon oxide films 24 and 22 is performed with an etching gas such as $C_4F_8$ with the silicon nitride film 21 used as an etching stopper, to completely remove the silicon oxide film 24 on the platinum film 23 and the silicon oxide film 22 other than a portion below the platinum film 23.

At this time, though an edge of the titanium nitride film 31 becomes round by sputter etching, since the titanium nitride film 31 has a thickness of about 20 nm, the titanium nitride film 31 is not completely removed and it is therefore possible to prevent the sputter etching from reaching the upper edge of the platinum film 23.

Further, though the thin titanium nitride film is formed between the upper main surface of the platinum film 23 and the silicon oxide film 22 to serve as the adhesion layer AD2 in the preferred embodiment, it is needless to say that the adhesion layer AD2, if being thicker, also serves as a protection film for the platinum film 23, like the titanium nitride film 31.

Next, in the step of FIG. 10, the titanium nitride film 31 is removed by sputter etching. If this etching is performed under the condition that, e.g., the chlorine gas is used and the source power is set in a range from 500 to 2000 W and the bias power is set in a range from 20 to 50 W, i.e., a low bias condition, the reactive ion etching proceeds in a state of low contribution of sputtering. In this etching, though the titanium nitride film 31 is removed, the sputter etching does not reach the platinum film 23 therebelow.

Furthermore, also when a material such as TiSiN, AlN and TiAlN or other film formed mainly of Ti or Al is used as the sacrifice film, it is possible to suppress rounding of the upper edge of the platinum film 23 by the same method. If a dielectric film such as BST, ST, BT, PZT, PLZT, PT and PZ is used as the sacrifice film, by wet etching with, e.g., solution of nitric acid, it is possible to remove the sacrifice film without damaging the platinum film 23 or the underlying layer thereof.

Thus, by forming the titanium nitride film 31 on the platinum film 23 and using the film 31 as a protection film for the platinum film 23 in removing the hardmask, it is possible to suppress rounding of the upper edge of the platinum film 23.

Further, in removing the sacrifice nitride film 31, by performing the sputter etching under the low bias condition or performing a wet etching, it is also possible to suppress rounding of the upper edge of the platinum film 23.

<E. The Second Variation>

As a method for preventing rounding of the upper edge of the platinum film 23, it is also effective to remove the hardmask by wet etching.

Hereafter, a manufacturing method intended to prevent etching of the upper edge of the platinum film 23 will be discussed, referring to FIGS. 11 to 14. Further, in FIGS. 11 to 14, for simplification, the structure of the MOS transistor and the like will be omitted.

First, through the step discussed referring to FIG. 2, the platinum film 23 having a thickness of about 200 nm is formed on the silicon oxide film 22 by, e.g., the sputtering method.

After that, in the step of FIG. 11, a BST film 41 having a thickness of 70 nm is formed as a hardmask on the platinum film 23 by, e.g., the sputtering method. Further, needless to say, the thin adhesion layers AD1 and AD2 may be formed between the lower main surface of the platinum film 23 and the silicon oxide film 22 and the upper main surface of the platinum film 23 and the BST film 41.

Then, a resist mask (not shown) which is so patterned as to correspond to the pattern of the capacitor lower electrode is formed on the BST film 41, and the BST film 41 is patterned by etching with the resist mask used as an etching mask. In this etching, the platinum film 23 serves as an etching stopper.

Figure 12:
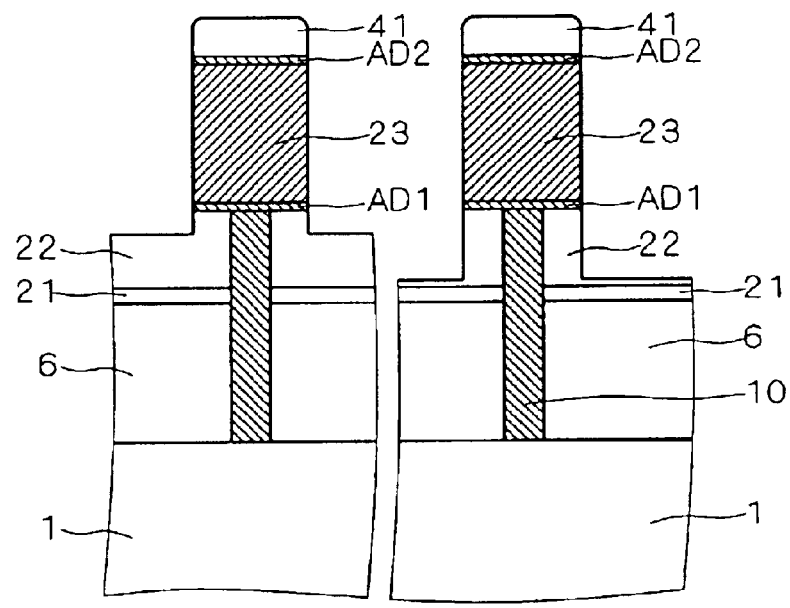

Next, in the step of FIG. 12, after removing the resist mask remaining on the BST film 41 by, e.g., oxygen plasma treatment, the platinum film 23 is patterned by dry etching with the BST film 41 used as a hardmask. The condition for this etching is the same as that in the step discussed in the preferred embodiment referring to FIG. 5.

In this etching, the selection ratio of the platinum film 23 to the BST film 41 is in a range from 5 to 7, being large, and therefore the BST film 41 is etched by only about 30 nm.

Figure 13:
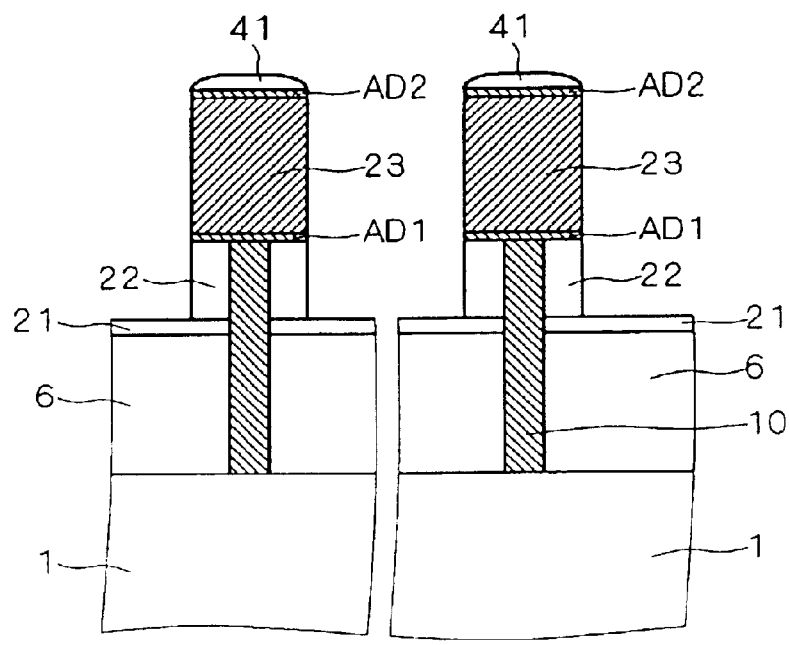

Next, in the step of FIG. 13, sputter etching of the silicon oxide film 22 is performed with an etching gas such as $C_4F_8$ with the silicon nitride film 21 used as an etching stopper, to completely remove the silicon oxide film 22 other than a portion below the platinum film 23.

In this etching, the selection ratio of the silicon oxide film 22 to the BST film 41 is in a range from 4 to 5, and therefore the BST film 41 is etched by only about 20 nm and the BST film 41 having a thickness of about 20 nm remains on the platinum film 23.

Figure 14:
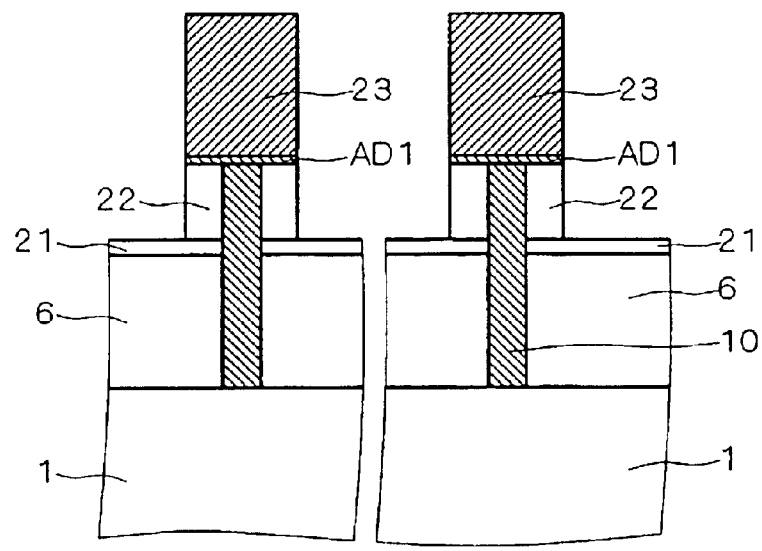
Figure 15:
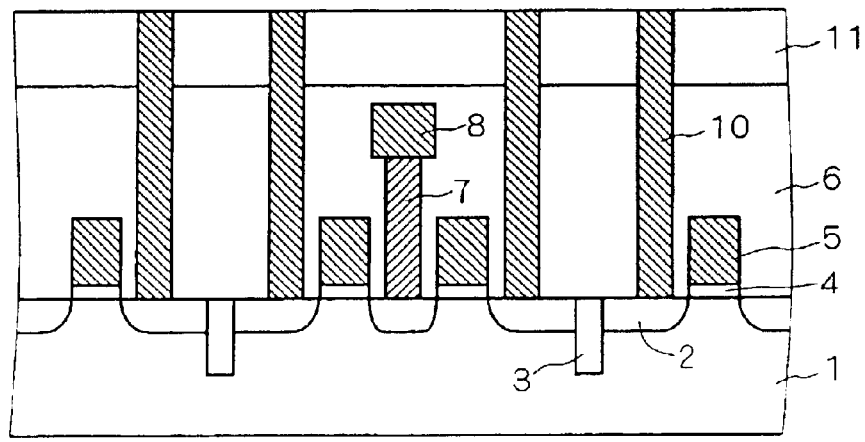
FIGS. 15 to 19 are cross sections showing process steps for manufacturing a semiconductor device in the background art.
Figure 16:
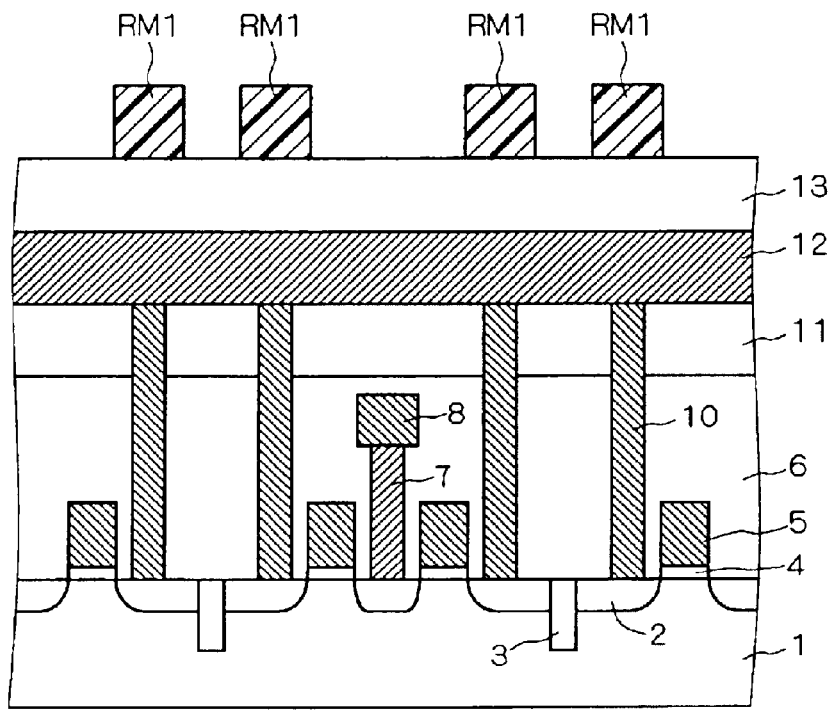
Figure 17:
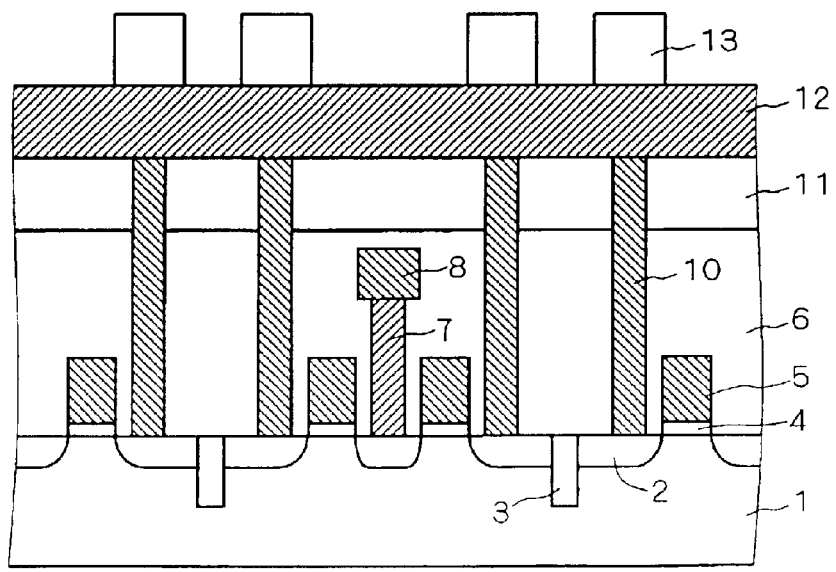
Figure 18:
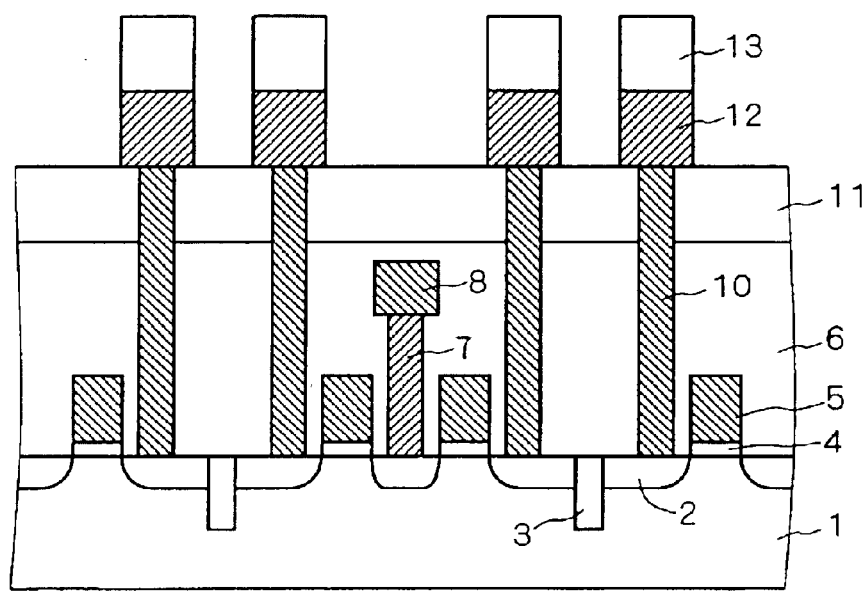
Figure 19:
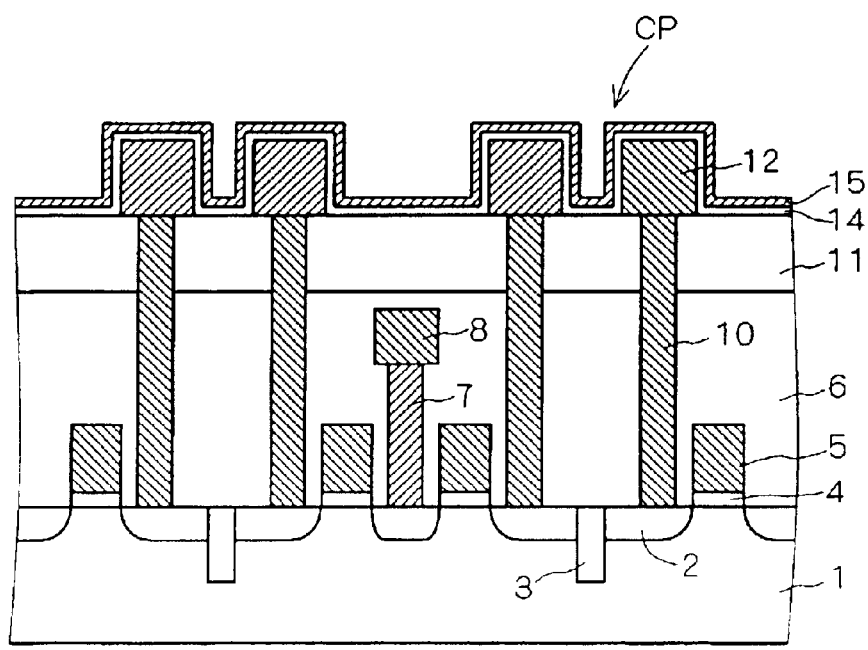

After that, in the step of FIG. 14, the BST film 41 remaining on the platinum film 23 is removed by wet etching with, e.g., solution of nitric acid.

Thus, by using the BST film 41 as a hardmask, the selectivity of the platinum film 23 to the hardmask becomes larger and this makes it possible to suppress rounding of the upper edge of the platinum film 23 which should be left as the capacitor lower electrode in patterning the platinum film 23. Moreover, by removing the BST film 41 through wet etching with solution of nitric acid, it is possible to completely remove the BST film 41 without damaging the platinum film 23 or the underlying layer thereof.

Further, as a method of removing the BST film 41, a wet etching with a mixture of hydrofluoric acid and hydrochloric acid, not limited to the solution of nitric acid, is also effective.

Furthermore, as the hardmask, not limited to the BST, a dielectric such as PZT and other metallic oxides such as $TiO_2$, $ZrO_2$, $SrTiO_3$ and $BaTiO_3$ are also effective, and an etching solution may be selected depending on the material of the hardmask.

Since the BST can be used as the capacitor dielectric film 14, when an insulating film of high dielectric constant such as a BST film is used as a hardmask, the insulating film is sometimes left, not being removed.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device which comprises a capacitor having a lower electrode selectively formed on an underlying layer, a dielectric film covering said lower electrode and an upper electrode opposed to said lower electrode with said dielectric film interposed therebetween, comprising the steps of:

(a) forming first and second etching stopper films of silicon nitride and silicon oxide, respectively, in this order as said underlying layer on an interlayer insulating film, and forming a contact plug penetrating said first and second etching stopper films and said interlayer insulating film;

(b) forming a conductive film which is to become said lower electrode on said second etching stopper film;

(c) forming a hardmask having a pattern corresponding to a plane pattern of said lower electrode on said conductive film;

(d) patterning at least said conductive film with said hardmask used as an etching mask and said second etching stopper film as an etching stopper to form said lower electrode;

(e) completely removing at least said second etching stopper film other than a portion below said lower electrode with said first etching stopper film used as an etching stopper; and (f) forming said dielectric film and said upper electrode so as to cover said lower electrode and said second etching stopper film remaining below said lower electrode.

2. The method of manufacturing a semiconductor device according to claim 1, wherein said step (d) includes the step of:

forming said conductive film mainly of a platinum-group element or an oxide including a platinum-group element.

3. A method of manufacturing a semiconductor device according to claim 1, wherein said step (c) includes the step of:

forming said hardmask of a silicon oxide film, and said step (e) includes the step of:

removing also said hardmask.

4. The method of manufacturing a semiconductor device according to claim 1, further comprising the steps of:

forming a sacrifice film having a small etching selectively to said second etching stopper film on said conductive film before said step (c); and removing said sacrifice film remaining on said lower electrode before said step (f), wherein said step (d) includes the step of:

patterning also said sacrifice film with said hardmask as an etching mask.

5. The method of manufacturing a semiconductor device according to claim 4, wherein said sacrifice film is one selected out of Ti, TiN, TiSiN, AlN, TiAlN, BST (barium strontium titinate), ST ($SrTiO_3$), BT ($BaTiO_3$), PZT (lead zirconate titanate), PLZT (addition lanthanum lead zirconate titanate), PT ($PbTiO_3$) and PZ ($PbZrO_3$).

6. The method of manufacturing a semiconductor device according to claim 5, wherein said step of removing said sacrifice film includes the step of:

removing said sacrifice film by reactive ion etching when said sacrifice film is one selected out of Ti, TiN, TiSiN, AlN and TiAlN, and such a condition as said etching proceeds in a state of low contribution of sputtering with ions is selected.

7. The method of manufacturing a semiconductor device according to claim 5, wherein said step of removing said sacrifice film includes the step of:

removing said sacrifice film by wet etching when said sacrifice film is one selected out of BST, ST, BT, PZT, PLZT, PT and PZ.

8. The method of manufacturing a semiconductor device according to claim 2, wherein said step (c) includes the step of:

forming said hardmask of a metallic oxide, and said method further comprising the step of:

removing said metallic oxide remaining on said lower electrode before said step (f).

9. The method of manufacturing a semiconductor device according to claim 8, wherein said metallic oxide is a dielectric.

10. The method of manufacturing a semiconductor device according to claim 9, wherein said dielectric out of BST, ST, BT, PZT, PLZT, PT and PZ.

* * * * *